(12) United States Patent
Cho et al.

(10) Patent No.: US 11,133,040 B2
(45) Date of Patent: Sep. 28, 2021

(54) SEMICONDUCTOR MEMORY DEVICE AND A MEMORY SYSTEM HAVING THE SAME

(71) Applicant: SAMSUNG ELECTRONICS CO., LTD., Suwon-si (KR)

(72) Inventors: Jeonghyeon Cho, Hwaseong-si (KR); Seonghoon Joo, Hwaseong-si (KR); Ilhan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/852,986

(22) Filed: Apr. 20, 2020

(65) Prior Publication Data

US 2021/0082478 A1    Mar. 18, 2021

(30) Foreign Application Priority Data

Sep. 16, 2019 (KR) ................ 10-2019-0113429

(51) Int. Cl.
| | | |
|---|---|---|
| G11C 7/04 | (2006.01) | |
| G11C 7/22 | (2006.01) | |
| G11C 7/06 | (2006.01) | |
| G11C 7/16 | (2006.01) | |

(52) U.S. Cl.
CPC ............ *G11C 7/04* (2013.01); *G11C 7/062* (2013.01); *G11C 7/16* (2013.01); *G11C 7/22* (2013.01)

(58) Field of Classification Search
CPC .. G11C 7/04; G11C 7/22; G11C 7/062; G11C 7/16; G11C 2207/2272; G11C 7/1045; G11C 7/222; G11C 7/1093; G11C 7/1066; G11C 7/1063; G11C 7/1006

USPC ........................................... 365/211
See application file for complete search history.

(56) References Cited

U.S. PATENT DOCUMENTS

| | | |
|---|---|---|
| 6,554,470 B2 | 4/2003 | Zhang et al. |
| 6,694,282 B2 | 2/2004 | Perner |
| 6,744,324 B1 | 6/2004 | Adams et al. |
| 6,934,652 B2 | 8/2005 | Gauthier et al. |
| 7,108,420 B1 | 9/2006 | Schnaitter |
| 7,118,273 B1 | 10/2006 | Schnaitter |
| 7,791,418 B2 | 9/2010 | Gros |
| 7,952,368 B1 | 5/2011 | Dai et al. |
| 8,238,185 B2 | 8/2012 | Lee et al. |
| 8,296,093 B2 | 10/2012 | Zanardi et al. |
| 8,348,505 B2 | 1/2013 | Nguyen Hoang et al. |

(Continued)

*Primary Examiner* — Hoai V Ho
*Assistant Examiner* — Minh Dinh
(74) *Attorney, Agent, or Firm* — F. Chau & Associates, LLC

(57) ABSTRACT

A semiconductor memory device includes: a temperature sensor configured to sense an internal temperature of the semiconductor memory device and generate a temperature signal; and a temperature code storage unit configured to receive the temperature signal in response to a temperature code write control signal that is generated when an operation corresponding to a specific command is performed, generate an operating temperature code corresponding to the temperature signal, compare the operating temperature code with a previously stored temperature code, store a larger temperature code of the operating temperature code and the previously stored temperature code as a maximum temperature code, and output the maximum temperature code to an external source in response to a temperature code read control signal.

20 Claims, 11 Drawing Sheets

(56) References Cited

U.S. PATENT DOCUMENTS

| | | |
|---|---|---|
| 9,064,545 B2 | 6/2015 | Cho et al. |
| 9,114,399 B2 | 8/2015 | Knight et al. |
| 9,183,910 B2 | 11/2015 | Lee et al. |
| 9,222,843 B2 | 12/2015 | Schnaitter |
| 9,268,378 B2 | 2/2016 | Rotem et al. |
| 9,355,705 B2 | 5/2016 | Furutani et al. |
| 9,514,801 B1 * | 12/2016 | Lee .................. G11C 11/40626 |
| 9,526,812 B2 | 12/2016 | Doshi et al. |
| 9,583,174 B1 | 2/2017 | Kim |
| 9,589,599 B2 | 3/2017 | Park |
| 9,715,913 B1 | 7/2017 | Yin et al. |
| 9,737,245 B2 | 8/2017 | Besling |
| 9,833,278 B2 | 12/2017 | Yasunaga |
| 10,228,872 B2 | 3/2019 | Nakata et al. |
| 2002/0173930 A1 | 11/2002 | Perner |
| 2003/0031229 A1 | 2/2003 | Zhang et al. |
| 2003/0168605 A1 | 9/2003 | Chambaud et al. |
| 2005/0114061 A1 | 5/2005 | Gauthier et al. |
| 2009/0160569 A1 | 6/2009 | Gros |
| 2010/0110815 A1 * | 5/2010 | Lee .......................... G11C 7/04 365/211 |
| 2011/0150028 A1 | 6/2011 | Nguyen Hoang et al. |
| 2011/0156799 A1 | 6/2011 | Zanardi et al. |
| 2012/0013364 A1 | 1/2012 | Schnaitter |
| 2012/0052560 A1 | 3/2012 | Knight et al. |
| 2012/0259188 A1 | 10/2012 | Besling |
| 2013/0060499 A1 | 3/2013 | Yoshimura |
| 2013/0223143 A1 | 8/2013 | Cho et al. |
| 2013/0245619 A1 | 9/2013 | Yasunaga |
| 2013/0257329 A1 | 10/2013 | Orou et al. |
| 2013/0322162 A1 | 12/2013 | Lee et al. |
| 2014/0303804 A1 | 10/2014 | Priel et al. |
| 2015/0006937 A1 | 1/2015 | Rotem et al. |
| 2015/0131389 A1 | 5/2015 | Furutani et al. |
| 2016/0045954 A1 | 2/2016 | Kusaka |
| 2016/0051985 A1 | 2/2016 | Knight et al. |
| 2016/0301390 A1 * | 10/2016 | Park .......................... G11C 7/20 |
| 2016/0320247 A1 | 11/2016 | Sohnaitter |
| 2017/0222461 A1 | 8/2017 | Kung |
| 2017/0262198 A1 | 9/2017 | Nakata et al. |
| 2018/0053539 A1 * | 2/2018 | Shin ....................... G11C 29/00 |
| 2018/0120165 A1 | 5/2018 | Christensen |
| 2018/0172522 A1 | 6/2018 | Lee et al. |
| 2018/0356295 A1 | 12/2018 | Schnaitter |
| 2019/0311764 A1 * | 10/2019 | Chae .................. G11C 11/4093 |

* cited by examiner

SEMICONDUCTOR MEMORY DEVICE AND A MEMORY SYSTEM HAVING THE SAME

CROSS-REFERENCE TO RELATED APPLICATION

This U.S. non-provisional patent application claims priority under 35 U.S.C. § 119 to Korean Patent Application No. 10-2019-0113429, filed on Sep. 16, 2019, in the Korean Intellectual Property Office (KIPO), the disclosure of which is incorporated by reference herein in its entirety.

1. TECHNICAL FIELD

The present inventive concept relates to a semiconductor memory device and a memory system having the same.

2. DISCUSSION OF RELATED ART

A semiconductor memory device may be sensitive to temperature. Accordingly, a semiconductor memory device may include a temperature sensor and may control an internal operation depending on a temperature sensed by the temperature sensor.

In some cases, an external device (for example, a controller or a test system) may control the operation of the semiconductor memory device based on the temperature sensed by the temperature sensor.

SUMMARY

A semiconductor memory device according to an exemplary embodiment of the present inventive concept includes: a temperature sensor configured to sense an internal temperature of the semiconductor memory device and generate a temperature signal; and a temperature code storage unit configured to receive the temperature signal in response to a temperature code write control signal that is generated when an operation corresponding to a specific command is performed, generate an operating temperature code corresponding to the temperature signal, compare the operating temperature code with a previously stored temperature code, store a larger temperature code of the operating temperature code and the previously stored temperature code as a maximum temperature code, and output the maximum temperature code to an external source in response to a temperature code read control signal.

A semiconductor memory device according to an exemplary embodiment of the present inventive concept includes: an internal clock signal generator configured to receive an external clock signal from an external source and generate an internal clock signal; a command and address generator configured to receive a command and address from the external source in response to the external clock signal, decode a command signal included in the command and address to generate an active command, a read command, a write command, or a mode setting command, generate an address signal included in the command and address applied with the active command as a row address, generate the address signal included in the command and address applied with the read command or the write command as a column address, and generate the address signal included in the command and address applied with the mode setting command as a mode setting code; a mode setting register configured to receive the mode setting code in response to the mode setting command and set a read latency, a write latency, and a burst length; a latency controller configured to generate a read latency control signal, a temperature code write control signal, and a temperature code read control signal using the read latency, the internal clock signal, or the burst length when the specific command is the read command, or generate a write latency control signal, the temperature code write control signal, and the temperature code read control signal using the write latency, the internal clock signal, or the burst length when the specific command is a write command; a temperature sensor configured to sense an internal temperature of the semiconductor memory device and generate a temperature signal; a temperature code storage unit configured to receive the temperature signal in response to the temperature code write control signal to generate an operating temperature code corresponding to the temperature signal, compare the operating temperature code with a previously stored maximum temperature code and store a larger temperature code of the operating temperature code and the previously stored maximum temperature code as a maximum temperature code, and output the maximum temperature code or a temperature range code corresponding to the maximum temperature code to the external source in response to the temperature code read control signal; a row decoder configured to decode the row address to generate a plurality of word line selection signals; a column decoder configured to decode the column address to generate a plurality of column selection signals; a memory cell array including a plurality of memory cells, and configured to store input data in the memory cells selected by the plurality of word line selection signals and the plurality of column selection signals, or generate output data from the selected memory cells; a data read unit configured to receive the output data output from the memory cell array in response to the read latency control signal to output the output data to the external source through data terminals; and a data write unit configured to receive data from the external source through the data terminals in response to the write latency control signal to output the received data to the memory cell array.

A memory system according to an exemplary embodiment of the present inventive concept includes: a control unit configured to transmit a command and address in response to an external clock signal, transmit and receive data, and receive a maximum temperature code; and a memory configured to receive the command and address in response to the external clock signal, transmit and receive the data, and transmit the maximum temperature code, wherein the memory includes: a temperature sensor configured to sense an internal temperature of the memory and generate a temperature signal; and a temperature code storage unit configured to receive the temperature signal in response to a temperature code write control signal that is generated when an operation corresponding to a specific command is actually performed, generate an operating temperature code corresponding to the temperature signal, compare the operating temperature code with a previously stored temperature code, store a larger temperature code of the operating temperature code and the previously stored code as the maximum temperature code, and output the maximum temperature code to the external source in response to a temperature code read control signal.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Hereinafter, a semiconductor memory device and a memory system having the same according to exemplary embodiments of the present inventive concept will be described with reference to the accompanying drawings.

Figure 1:
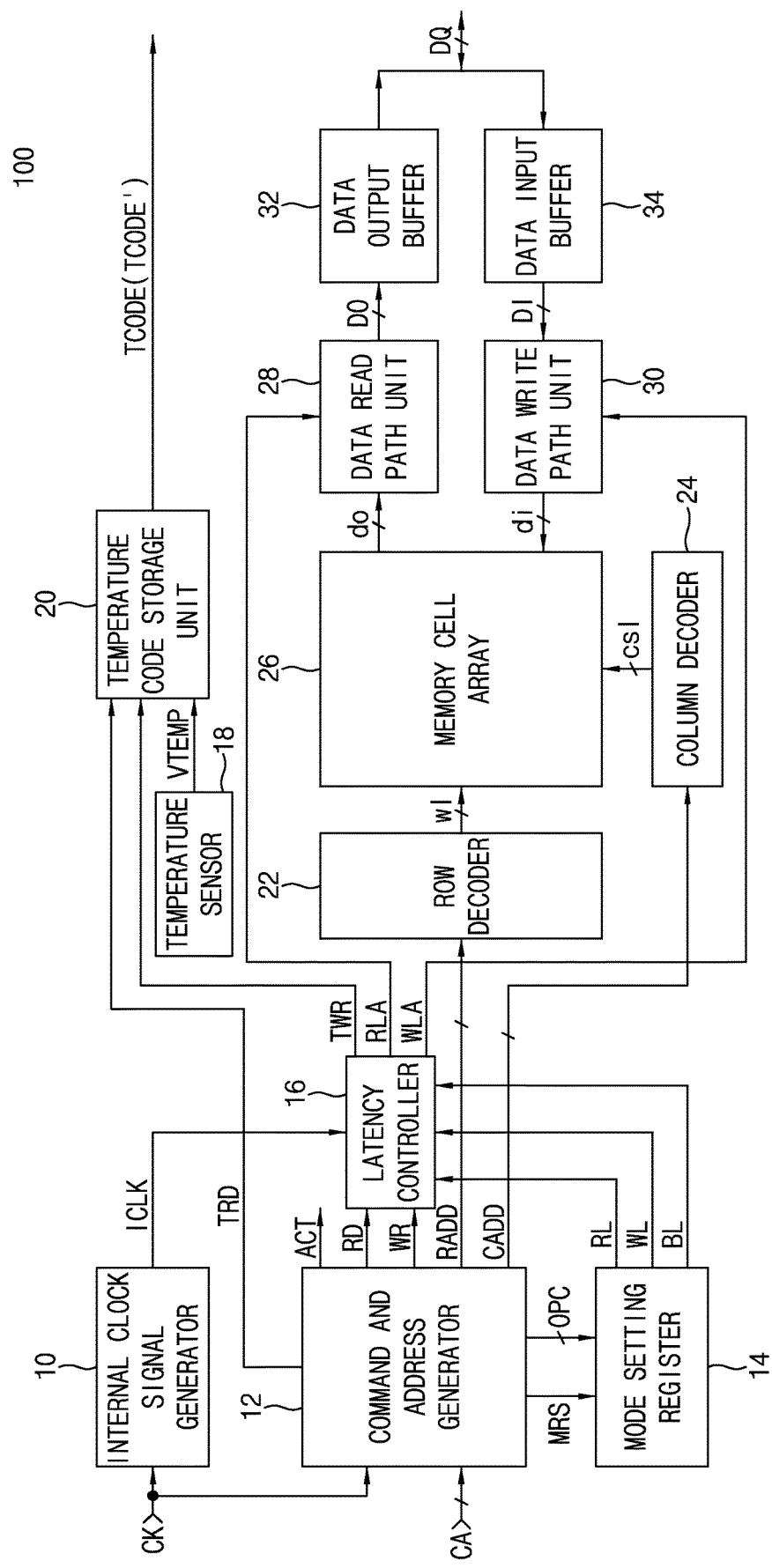
FIGS. 1, 2, 3 and 4 each show a block diagram of a configuration of a semiconductor memory device according to an exemplary embodiment of the present inventive concept.

FIG. 1 is a block diagram illustrating a configuration of a semiconductor memory device according to an exemplary embodiment of the present inventive concept. The semiconductor memory device 100 includes an internal clock signal generator 10, a command and address generator 12, a mode setting register 14, a latency controller 16, a temperature sensor 18, a temperature code storage unit 20, a row decoder 22, a column decoder 24, a memory cell array 26, a data read path unit 28, a data write path unit 30, a data output buffer 32, and a data input buffer 34.

A function of each of the blocks shown in FIG. 1 will be described below.

The internal clock signal generator 10 may receive an external clock signal CK applied from an external source to generate an internal clock signal ICLK. The internal clock signal generator 10 may be a delay lock loop circuit.

The command and address generator 12 may receive a command and address CA applied from the external source in response to the external clock signal CK to generate an internal command and address. The command and address generator 12 may decode a command signal included in the command and address CA to generate a mode setting command MRS, an active command ACT, a write command WR, or a read command RD which is an internal command. In addition, the command and address generator 12 may generate an address signal included in the command and address CA as a row address RADD, a column address CADD, or a mode setting code OPC. For example, the command and address generator 12 may generate the mode setting code OPC with the mode setting command MRS, generate the row address RADD with the active command ACT, and the column address CADD together with the write command WR or the read command RD. In addition, the command and address generator 12 may decode the command signal included in the command and address CA to generate a temperature code read control signal TRD.

The mode setting register 14 may receive the mode setting code OPC in response to the mode setting command MRS to set a read latency RL, a write latency WL, and a burst length BL. The mode setting command MRS may be a test mode setting command that is applied during a test operation or the mode setting command that is applied during a normal operation.

When the read command RD is applied, the latency controller 16 may generate a temperature code write control signal TWR, a read latency control signal RLA, and a write latency control WLA using the read latency RL, the write latency WL and the burst length BL in response to the internal clock signal ICLK. When the read command RD is applied, the latency controller 16 may generate the read latency control signal RLA which is deactivated by being delayed by the number of clock cycles corresponding to the burst length BL after being activated by being delayed by the number of clock cycles corresponding to the read latency RL in response to the internal clock signal ICLK. In addition, when the write command WR is applied, the latency controller 16 may generate the write latency control signal WLA which is deactivated by being delayed by the number of clock cycles corresponding to the burst length BL after being activated by being delayed by the number of clock cycles corresponding to the write latency WL in response to the internal clock signal ICLK. Further, the latency controller 16 may generate the temperature code write control signal TWR using the read latency RL or the write latency WL in response to the internal clock signal ICLK. For example, the latency controller 16 may generate the temperature code write control signal TWR based on the read latency control signal RLA or the write latency control signal WLA. The temperature code write control signal TWR may be a pulse signal generated at the activation time point or during an activation period of the read latency control signal RLA or the write latency control signal WLA (in other words, when data is inputted or outputted through data terminals). In addition, the temperature code write control signal TWR may be a pulse signal generated before a predetermined number of clock cycles from the activation time point of the read latency control signal RLA or the write latency control signal WLA (in other words, when the memory cell array 26 performs a read operation or a write operation in response to the read command RD or the write command WR).

The temperature sensor 18 may detect an internal temperature and generate a temperature signal VTEMP corresponding to the internal temperature. For example, the temperature signal VTEMP may be a temperature voltage VTEMP that changes with an increase (or a decrease) in temperature.

The temperature code storage unit 20 may receive the temperature signal VTEMP in response to the temperature code write control signal TWR, generate a temperature code corresponding to the temperature signal VTEMP, compare the temperature code with a previously stored temperature code, store the temperature code corresponding to a larger temperature as a maximum temperature code TCODE, and output the maximum temperature code TCODE to the external source in response to the temperature code read control signal TRD. As another example, the temperature code storage unit 20 outputs a temperature range code TCODE' indicating a temperature range that the maximum temperature code TCODE belongs to. The temperature range may be one of at least two temperature ranges set by at least one temperature range designation code. The previously stored temperature code may be a temperature code stored in a previous operation in response to the temperature code write control signal TWR. The previously stored temperature code and the at least one temperature range designation code may be previously set or programmed temperature codes. The previously stored temperature code and the at least one temperature range designation code may be previously set by the mode setting code OPC applied to the mode setting register 14 in response to the mode setting command MRS. As an example, the maximum temperature code TCODE or the temperature range code TCODE' may be output in series through a separate temperature code output terminal (for example, a pin or ball) regardless of the temperature code read control signal TRD. As another example, the maximum temperature code TCODE or the temperature range code TCODE' may be output in parallel through the data output buffer 32 and data terminals in response to the temperature code read control signal TRD.

The row decoder 22 may decode the row address RADD to generate a plurality of word line selection signals wl.

The column decoder 24 may decode the column address CADD to generate a plurality of column selection signals csl.

The memory cell array 26 may include a plurality of memory cells, and output output data do, which is output from memory cells selected by the plurality of word line selection signals wl and the plurality of column selection signals csl, or store input data di in the selected memory cells.

The data read path unit 28 may receive the output data do in response to the read latency control signal RLA to generate data DO. The data read path unit 28 may receive the output data do in parallel and generate the data DO in series by a number of times corresponding to the burst length BL during an activation period of the read latency control signal RLA. For example, when the burst length BL is 16, the data read path unit 28 may output 8-bit data DO in series as many as 16 times corresponding to the burst length BL when the 128-bit output data do is received in parallel. The data output buffer 32 may buffer the data DO and output data DQ to the external source through the data terminals. Although the data read path unit 28 and the data output buffer 32 are configured as separate blocks, they may be configured as one data read unit.

The data write path unit 30 may receive data DI in response to the write latency control signal WLA to generate input data di. The data write path unit 30 may receive the data DI in series by a number of times corresponding to the burst length BL during an activation period of the write latency control signal WLA and generate the input data di in parallel. For example, when the burst length BL is 16, the data write path unit 30 may receive 8-bit data DI in series as many as 16 times corresponding to the burst length BL and generate 128-bit input data di in parallel. The data input buffer 34 may buffer data DQ received from the external source through the data terminals to generate the data DI. Although the data write path unit 30 and the data input buffer 34 are configured as separate blocks, they may be configured as one data write unit.

In an exemplary embodiment of the present inventive concept, the temperature code read control signal TRD may not be generated by the command and address generator 12. For example, the temperature code read control signal TRD may be applied through a separate temperature code read control signal input terminal of the semiconductor memory device 100, or may be set and generated by the mode setting code OPC applied to the mode setting register 14 in response to the mode setting command MRS.

Figure 2:
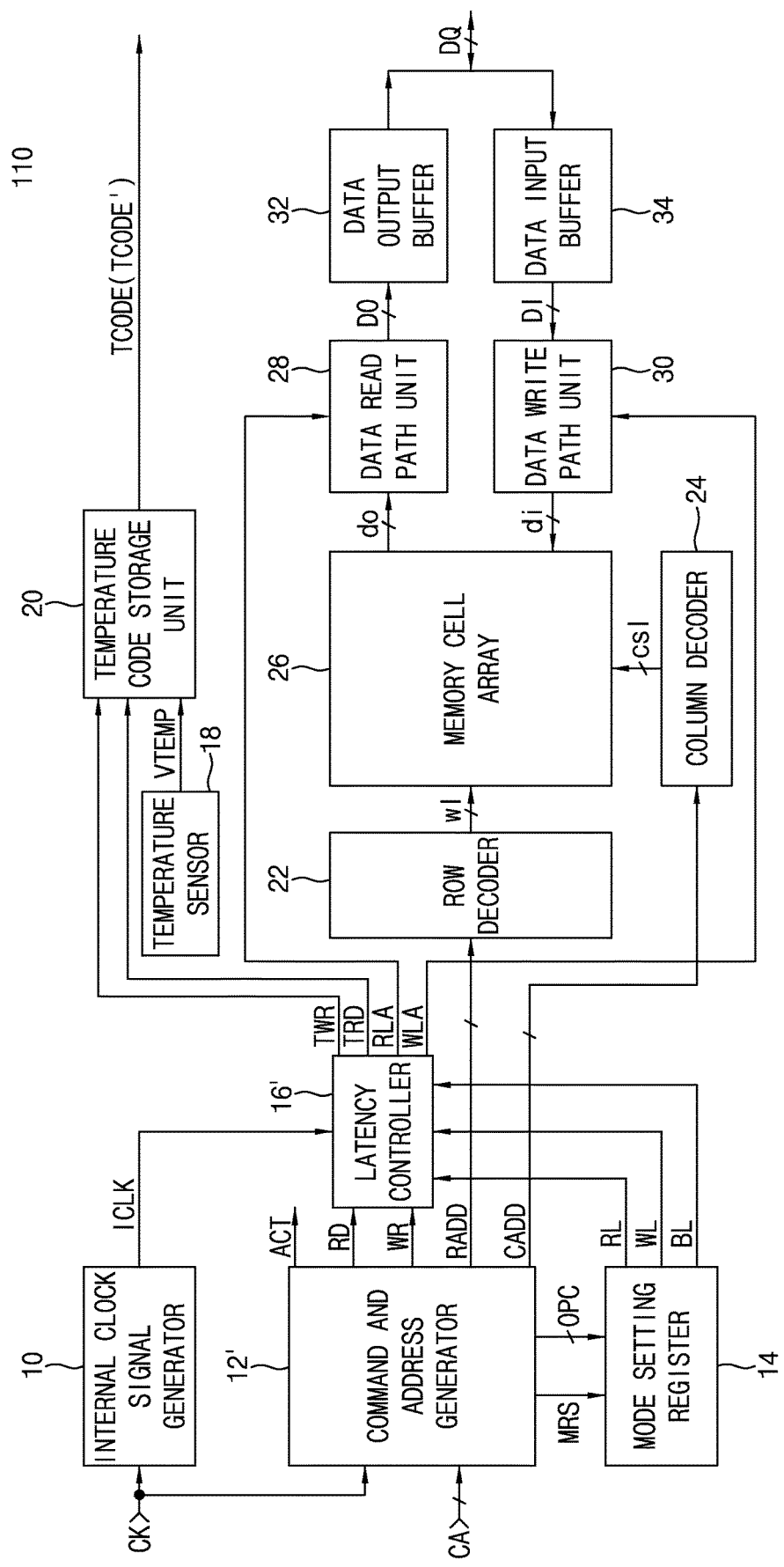

FIG. 2 is a block diagram illustrating a configuration of a semiconductor memory device according to an exemplary embodiment of the present inventive concept. The semiconductor memory device 110 may have the same configuration as the semiconductor memory device 100 shown in FIG. 1 except that the command and address generator 12 and the latency controller 16 are replaced with a command and address generator 12' and a latency controller 16', respectively.

In FIG. 2, the command and address generator 12' may not generate the temperature code read control signal TRD, unlike the command and address generator 12 of FIG. 1.

The latency controller 16' may generate the temperature code write control signal TWR, the read latency control signal RLA, and the write latency control signal WLA by performing the same operation as the latency controller 16 shown in FIG. 1. The latency controller 16' may additionally generate a temperature code read control signal TRD. The latency controller 16' may generate the temperature code read control signal TRD using the read latency RL or the write latency RL and the burst length BL in response to the internal clock signal ICLK. For example, the temperature code read control signal TRD may be a pulse signal generated after the activation period of the read latency control signal RLA or the write latency control signal WLA (in other words, after data is inputted and outputted through the data terminals.

The blocks shown in FIG. 2 that have the same reference numerals as the blocks shown in FIG. 1 may perform the same function as the blocks shown in FIG. 1.

Figure 3:
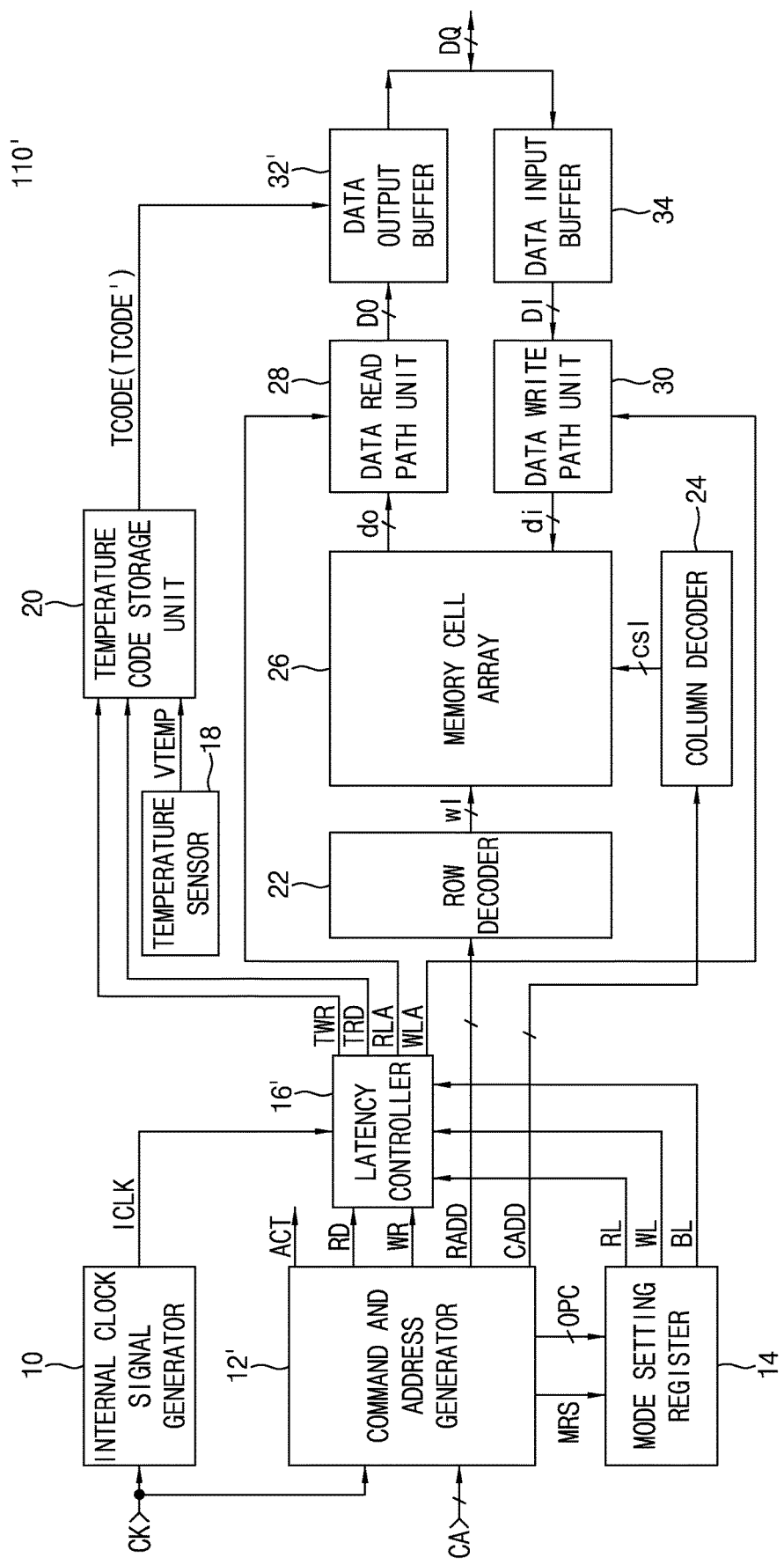

FIG. 3 is a block diagram illustrating a configuration of a semiconductor memory device according to an exemplary embodiment of the present inventive concept. The semiconductor memory device 110' of FIG. 3 may have the same configuration as the semiconductor memory device 110 shown in FIG. 2, except that the maximum temperature code TCODE or the temperature range code TCODE' is output to data terminals through the data output buffer 32'.

In other words, the semiconductor memory device 110' shown in FIG. 3 may output the maximum temperature code TCODE (or temperature range code TCODE') to the data terminals through the data output buffer 32' after the data DQ is inputted or outputted through the data terminals in response to a temperature code read control signal TRD generated after an activation period of the read latency control signal RLA or the write latency control signal WLA. In this case, the maximum temperature code TCODE (or the temperature range code TCODE') may be output in parallel through the data terminals. For example, when the maximum temperature code TCODE (or the temperature range code TCODE') is data of 8 bits or less, there may be 8 data terminals, and the data of 8 bits or less may be output in parallel.

Figure 4:
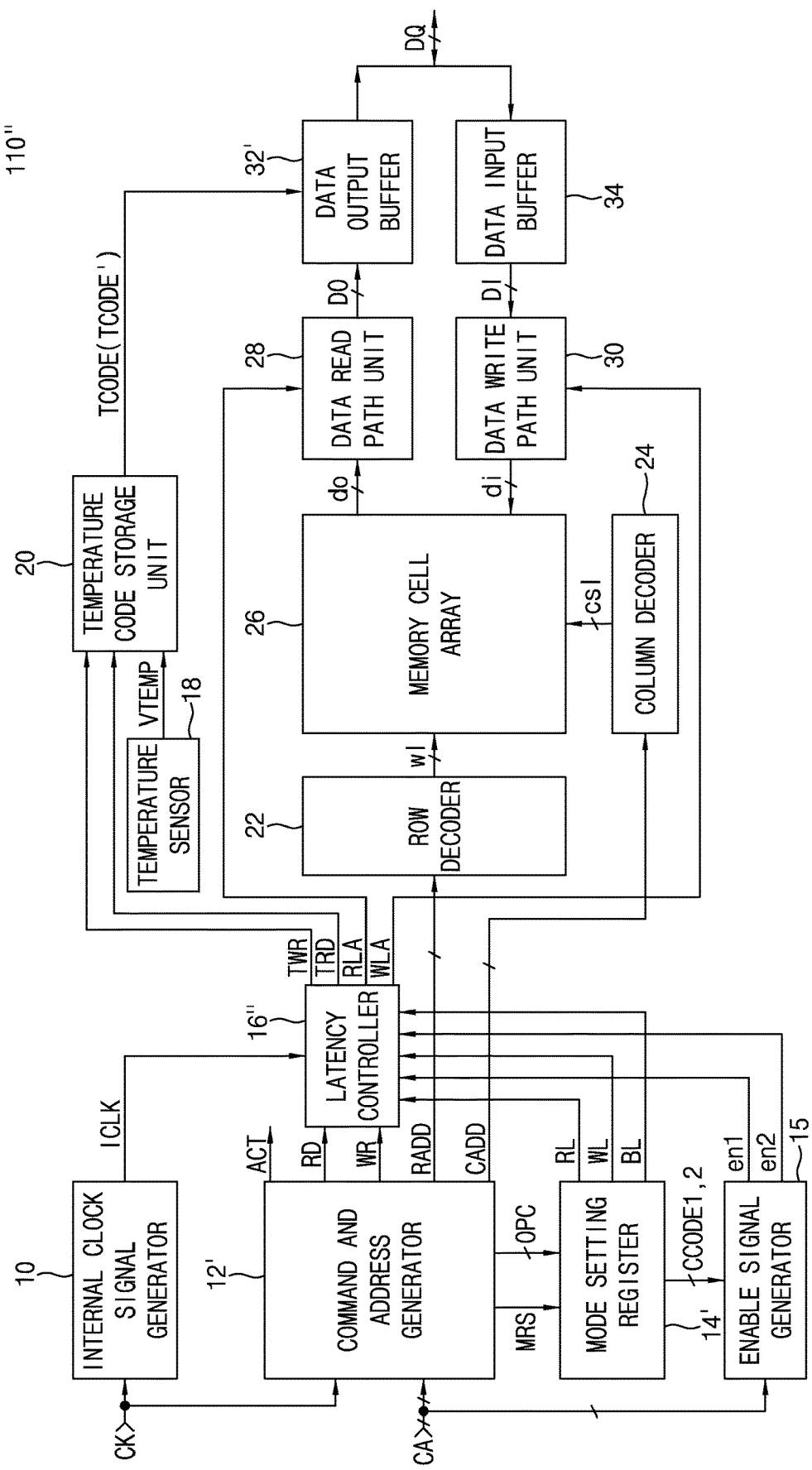

FIG. 4 is a block diagram illustrating a configuration of a semiconductor memory device according to an exemplary embodiment of the present inventive concept. Unlike the semiconductor memory device 110' shown in FIG. 3, the semiconductor memory device 110" may include the mode setting register 14' and the latency controller 16" instead of the mode setting register 14 and the latency controller 16', respectively, and may further include an enable signal generator 15.

In FIG. 4, the mode setting register 14' may receive the mode setting code OPC in response to the mode setting command MRS to set a command code CCODE. The command code CCODE may be a code corresponding to a command signal included in the command and address CA.

In addition, the command code CCODE may be a code corresponding to a command signal that requires the maximum temperature code TCODE (or the temperature range code TCODE') when an actual operation is performed. For example, the command code CCODE may be a code corresponding to a command signal for generating the read command RD and/or a code corresponding to a command signal for generating the write command WR. In other words, the command code CCODE may be one or more codes corresponding to one or more command signals.

When the code corresponding to the command signal included in the command and address CA matches the command code CCODE, the enable signal generator 15 may generate a first enable signal en1 or a second enable signal en2. For example, when the command code CCODE corresponds to a command signal for generating the read command RD, the enable signal generator 15 may activate the first enable signal en1. In other words, the enable signal generator 15 may activate the first enable signal en1 when the command signal included in the command and address signal CA corresponds to the read command RD when the command code CCODE corresponds to a command signal for generating the write command WR, the enable signal generator 15 may activate the second enable signal en2. In other words, the enable signal generator 15 may activate the second enable signal en2 when the command signal included in the command and address signal CA corresponds to the write command WR.

The latency controller 16" may perform the same function as the latency controller 16' shown in FIG. 3 to generate the read latency control signal RLA and the write latency control signal WLA. However, when the first enable signal en1 is activated, the latency controller 16" may generate the temperature code write control signal TWR and the temperature code read control signal TRD using the read latency RL and/or the burst length BL in response to the internal clock signal ICLK. In addition, when the second enable signal en2 is activated, the latency controller 16" may generate the temperature code write control signal TWR and the temperature code read control signal TRD using the write latency WL and/or the burst length BL in response to the internal clock signal ICLK. In other words, when the first enable signal en1 is activated and the second enable signal en2 is deactivated, the latency controller 16" may generate the temperature code write control signal TWR, the read latency control signal RLA, and the temperature code read control signal TRD in response to the read command RD, and generate the write latency control signal WLA in response to the write command WR. In addition, when the first enable signal en1 is deactivated and the second enable signal en2 is activated, the latency controller 16" may generate the read latency control signal RLA in response to the read command RD, and generate the temperature code write control signal TWR, the write latency control signal WLA, and the temperature code read control signal TRD in response to the write command WR. When both of the first enable signal en1 and the second enable signal en2 are activated, the latency controller 16" may perform the same operation as the latency controller 16' of FIG. 3.

The blocks shown in FIG. 4 that have the same reference numerals as the blocks shown in FIG. 3 may perform the same function as the blocks shown in FIG. 3.

The semiconductor memory device 110' or 110" shown in FIGS. 3 and 4 may not apply a separate temperature code read control signal and may not have a separate temperature code output terminal for storing the maximum temperature code TCODE (or temperature range code TCODE') and outputting the maximum temperature code TCODE (or temperature range code TCODE') to the external source.

Figure 5:
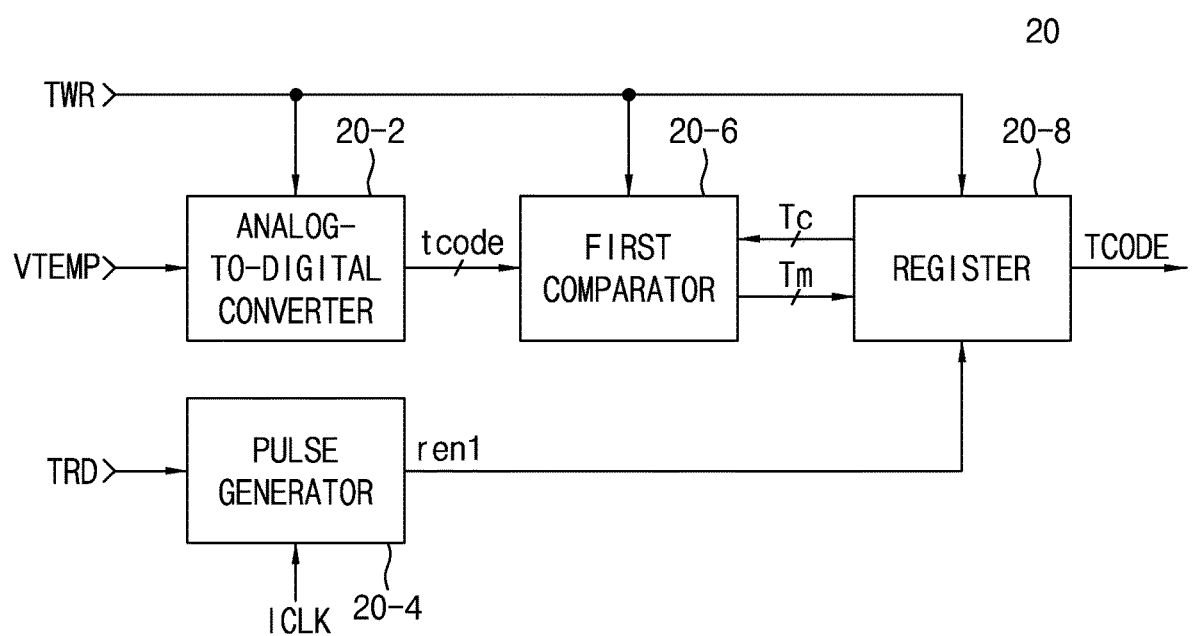
FIGS. 5, 6 and 7 each show a block diagram of a configuration of a temperature storage unit according to an exemplary embodiment of the present inventive concept.

FIG. 5 is a block diagram showing a configuration of the temperature storage unit according to an exemplary embodiment of the present inventive concept. The temperature storage unit 20 may include an analog-to-digital converter 20-2, a pulse generator 20-4, a first comparator 20-6, and a register 20-8.

A function of each of the blocks shown in FIG. 5 will be described below.

The analog-to-digital converter 20-2 may receive the temperature signal VTEMP in response to the temperature code write control signal TWR and perform an analog-to-digital conversion operation to generate an operating temperature code tcode. In other words, the analog-to-digital converter 20-2 may generate the operating temperature code tcode corresponding to the temperature signal VTEMP.

The pulse generator 20-4 may generate a first read pulse signal ren1 when the temperature code read control signal TRD is received. When the maximum temperature code TCODE (or the temperature range code TCODE') is output in series to the external source, the pulse generator 20-4 generate the first read pulse signal ren1 including a number of pulses corresponding to the number of bits of the maximum temperature code TCODE using the internal clock signal ICLK. For example, when the maximum temperature code TCODE is 8-bit data, the pulse generator 20-4 may generate the first read pulse signal ren1 including eight pulses. On the other hand, when the maximum temperature code TCODE is output in parallel to the external source, the pulse generator 20-4 may generate the first read pulse signal rent including one pulse using the internal clock signal ICLK.

The first comparator 20-6 may receive the operating temperature code tcode in response to the temperature code write control signal TWR, compare the operating temperature code tcode with a previously stored temperature code Tc, and generate the operating temperature code tcode as an output temperature code Tm when the operating temperature code tcode is larger (or smaller) than the previously stored temperature code Tc. On the other hand, the first comparator 20-6 may not generate the output temperature code Tm when the operating temperature code tcode is smaller (or larger) than the previously stored temperature code Tc.

The register 20-8 may output the previously stored temperature code Tc in response to the temperature code write control signal TWR, and when the output temperature code Tm is received at the register 20-8, the register 20-8 may store the output temperature code Tm instead of the previously stored temperature code Tc as the maximum temperature code TCODE. The previously stored temperature code Tc may be a temperature code stored in a previous operation in response to the temperature code write control signal TWR, or may be a preset or programmed temperature code. In addition, the register 20-8 may output the maximum temperature code TCODE in response to the first read pulse signal ren1. When the maximum temperature code TCODE is 8-bit data, the register 20-8 may output the maximum temperature code TCODE in series one bit at a time in response to the first read pulse signal rent including eight pulses, or output the maximum temperature code TCODE in parallel in response to the first read pulse signal rent including one pulse.

Figure 6:
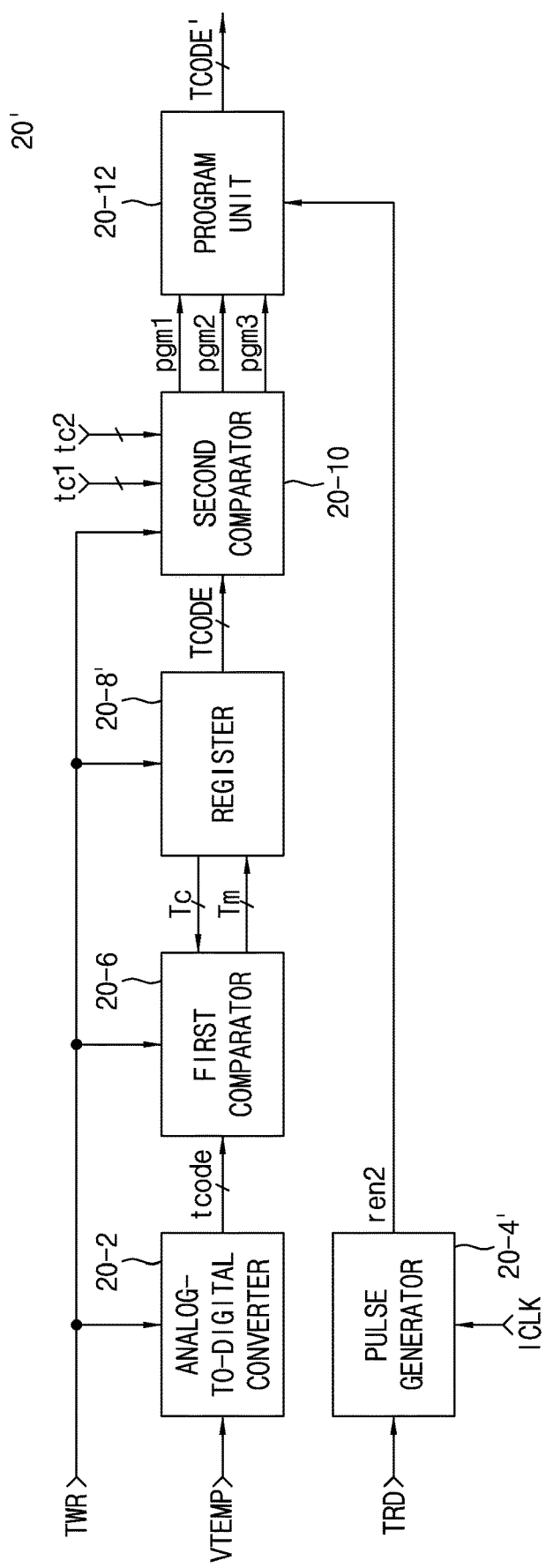

FIG. 6 is a block diagram illustrating a configuration of a temperature storage unit according to an exemplary embodiment of the present inventive concept. The temperature storage unit 20' may include an analog-to-digital converter 20-2, a pulse generator 20-4', a first comparator 20-6, a register 20-8', a second comparator 20-10, and a program unit 20-12.

A function of each of the blocks shown in FIG. 6 will be described as follows.

The analog-to-digital converter 20-2 may perform the same function as the analog-to-digital converter 20-2 shown in FIG. 5.

The pulse generator 20-4' may generate a second read pulse signal ren2 when the temperature read command TRD is received. When the temperature range code TCODE' is output in series to the external source, the pulse generator 20-4' may generate the second read pulse signal ren2 including a number of pulses corresponding to the number of bits of the temperature range code TCODE' using the internal clock signal ICLK. For example, when the temperature range code TCODE' is 3-bit data, the pulse generator 20-4' may generate a second read pulse signal ren2 including three pulses. On the other hand, when the temperature range code TCODE' is output in parallel to the external source, the pulse generator 20-4' may generate the second read pulse signal ren2 including one pulse using the internal clock signal ICLK.

The first comparator 20-6 may perform the same function as the first comparator 20-6 shown in FIG. 5. In this case, when the operating temperature code tcode is larger (or smaller) than the previously stored temperature code Tc, the first comparator 20-6 may output the output temperature code Tm.

The register 20-8' may perform the same operation as the register 20-8 shown in FIG. 5, and store the output temperature code Tm instead of the previously stored temperature code Tc as the maximum temperature code TCODE when the output temperature code Tm is received. In addition, the register 20-8' may maintain the previously stored temperature code Tc as the maximum temperature code TCODE when the output temperature code Tm is not received. However, unlike the register 20-8 shown in FIG. 5 that outputs the maximum temperature code TCODE in series, the register 20-8' may output the maximum temperature code TCODE in parallel. For example, the register 20-8' may output 8-bit data in parallel when the temperature code TCODE is 8-bit data.

The second comparator 20-10 may activate the at least one program signal by comparing the maximum temperature code TCODE with at least one previously stored temperature range designation code in response to the temperature code write control signal TWR. For example, the second comparator 20-10 may compare the maximum temperature code TCODE with two previously stored first and second temperature range designation codes tc1 and tc2, where tc1<tc2. When the maximum temperature code TCODE belongs to a first temperature range (in other words, TCODE≤tc1), the second comparator 20-10 may activate a first program signal pgm1, when the maximum temperature code TCODE belongs to a second temperature range (in other words, tc1<TCODE≤tc2), the second comparator 20-10 may activate a second program signal pgm2, and when the maximum temperature code TCODE belongs to a third temperature range (in other words, tc2<TCODE), the second comparator 20-10 may activate a third program signal pgm3. Unlike that shown in FIG. 6, the second comparator 20-10 may compare the maximum temperature code TCODE with only one previously stored temperature range designation code tc1, activate the first program signal pgm1 when the maximum temperature code TCODE belongs to a first temperature range (in other words, TCODE≤tc1), and activate the second program signal pgm2 when the maximum temperature code TCODE belongs to a second temperature range (in other words, tc1<TCODE).

The program unit 20-12 may program the temperature range code TCODE' in response to at least one of the program signals pgm1, pgm2 and pgm3, and output the temperature range code TCODE' in response to the second read pulse signal ren2. For example, the program unit 20-12 may generate a 3-bit temperature range code TCODE' in response to the first to third program signals pgm1, pgm2, and pgm3. The program unit 20-12 may generate the temperature range code TCODE' of "100" when the maximum temperature code TCODE belongs to the first temperature range, generate a temperature range code TCODE' of "010" when the maximum temperature code TCODE belongs to the second temperature range, and generate the temperature range code TCODE' of "001" when the maximum temperature code TCODE belongs to the third temperature range. When the temperature range code TCODE' is "110", it may indicate that the semiconductor memory device is operated in the first and second temperature ranges, and when the temperature range code TCODE is "111", it may indicate that the semiconductor memory device is operated in the first temperature range, the second temperature range, and the third temperature.

Unlike the temperature storage unit 20 shown in FIG. 5 that outputs the maximum temperature code TCODE corresponding to an internal temperature when the semiconductor memory device performs an actual operation, the temperature storage unit 20' shown in FIG. 6 may output the temperature range code TCODE' corresponding to a temperature range when the semiconductor memory device performs the actual operation.

Figure 7:
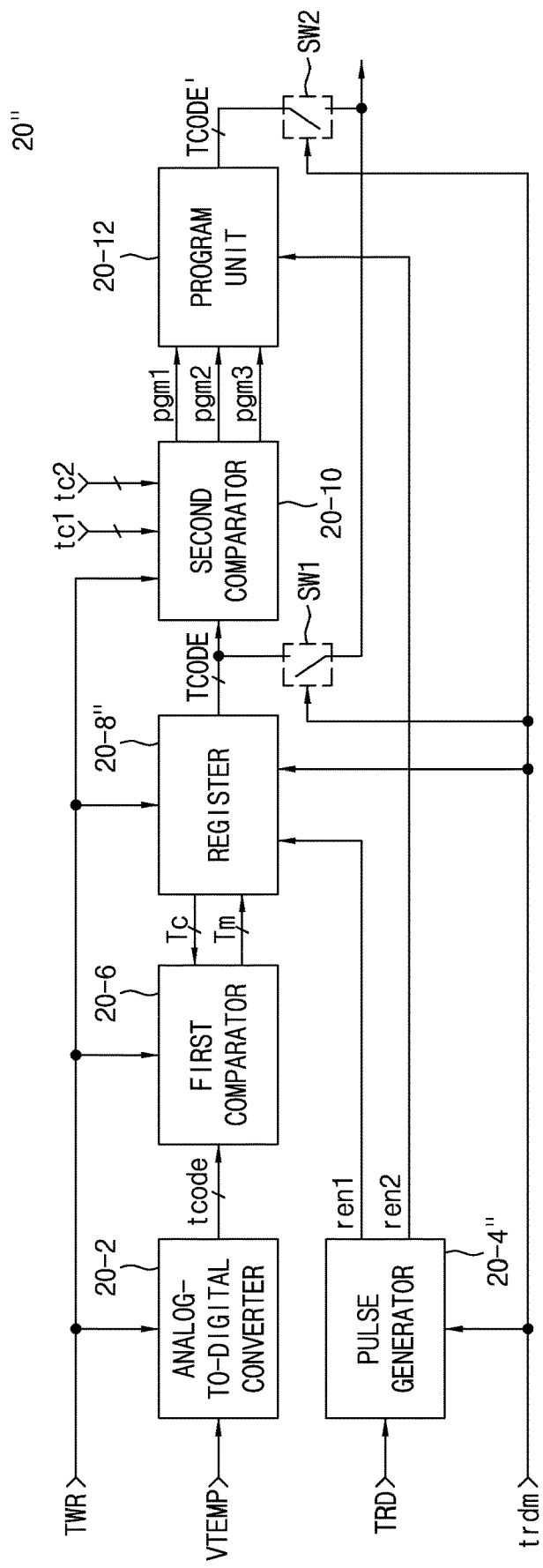

FIG. 7 is a block diagram showing a configuration of a temperature storage unit according to an exemplary embodiment of the present inventive concept. The temperature storage unit 20" may include a pulse generator 20-4" and a register 20-8" instead of the pulse generator 20-4' and the register 20-8' shown in FIG. 6, respectively, and further include first and second switches SW1 and SW2.

In FIG. 7, the register 20-8" may perform the same operation as the register 20-8' shown in FIG. 6 in response to the temperature code write control signal TWR, store the output temperature code Tm instead of the previously stored temperature code Tc as the maximum temperature code TCODE when the output temperature code Tm is received, and maintain the previously stored temperature code Tc as the maximum temperature coded TCODE when the output temperature code Tm is not received. Further, the register 20-8" may output the maximum temperature code TCODE in series in response to the first read pulse signal rent when a temperature code read selection signal trdm is activated or output the maximum temperature code TCODE in parallel when the temperature code read selection signal trdm is deactivated.

The pulse generator 20-4" may generate a first read pulse signal ren1 when the temperature code read selection signal trdm is activated and the temperature code read control signal TRD is received. In other words, the pulse generator 20-4" may perform the same operation as the pulse generator 20-4 shown in FIG. 5 to generate the first read pulse signal ren1. In addition, the pulse generator 20-4" may generate a second read pulse signal ren2 when the temperature code read selection signal trdm is deactivated and the temperature code read control signal TRD is received. In other words, the pulse generator 20-4″ may perform the same operation as the pulse generator 20-4 shown in FIG. 6 to generate the second read pulse signal ren2.

The first switch SW1 may be turned on when the temperature code read selection signal trdm is activated, and be turned off when the temperature code read selection signal trdm is deactivated. When the first switch SW1 is turned on the maximum temperature code TCODE may be output.

The second switch SW2 may be turned on when the temperature code read selection signal trdm is deactivated, and be turned off when the temperature code read selection signal trdm is activated. When the second switch SW2 is closed by the deactivated temperature code read selection signal trdm, a programmed temperature range code TCODE′ is output.

The blocks shown in FIG. 7 that have the same reference numerals as the blocks shown in FIG. 6 may perform the same function as the blocks shown in FIG. 6.

The temperature code read selection signal trdm shown in FIG. 7 may be set and output in the mode setting register 14 or 14′ of FIGS. 1 to 4 by the mode setting code OPC generated in response to the mode setting command MRS.

In other words, the temperature code storage unit 20″ shown in FIG. 7 may output the maximum temperature code TCODE corresponding to an internal temperature when the semiconductor memory device performs an actual operation in response to the temperature code read selection signal trdm, or output the temperature range code TCODE′ corresponding to a temperature range of the maximum temperature code.

Figure 8:
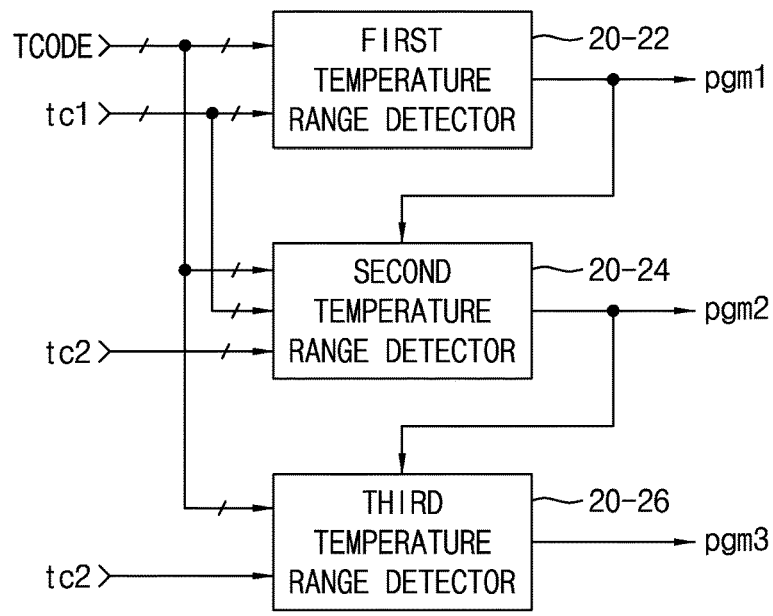
FIG. 8 is a block diagram showing a configuration of a second comparator according to an exemplary embodiment of the present inventive concept.

FIG. 8 is a block diagram showing a configuration of a second comparator according to an exemplary embodiment of the present inventive concept. The second comparator 20-10 may include a first temperature range detector 20-22, a second temperature range detector 20-24, and a third temperature range detector 20-26.

A function of each of the blocks shown in FIG. 8 will be described below.

The first temperature range detector 20-22 may activate a first program signal pgm1 when the maximum temperature code TCODE is less than or equal to the first temperature range designation code tc1. For example, the first temperature range designation code tc1 may be a temperature code corresponding to a temperature of 45° C.

The second temperature range detector 20-24 may activate a second program signal pgm2 when the maximum temperature code TCODE is greater than the first temperature range designation code tc1 and less than or equal to the second temperature range designation code tc2. For example, the second temperature range designation code tc2 may be a temperature code corresponding to a temperature of 85° C.

The third temperature range detector 20-26 may activate a third program signal pgm3 when the maximum temperature code TCODE is greater than the second temperature range designation code tc2. The output of the first temperature range detector 20-22 may be provided to the second temperature range detector 20-24, and the output of the second temperature range detector 20-24 may be provided to the third temperature range detector 20-26.

Figure 9:
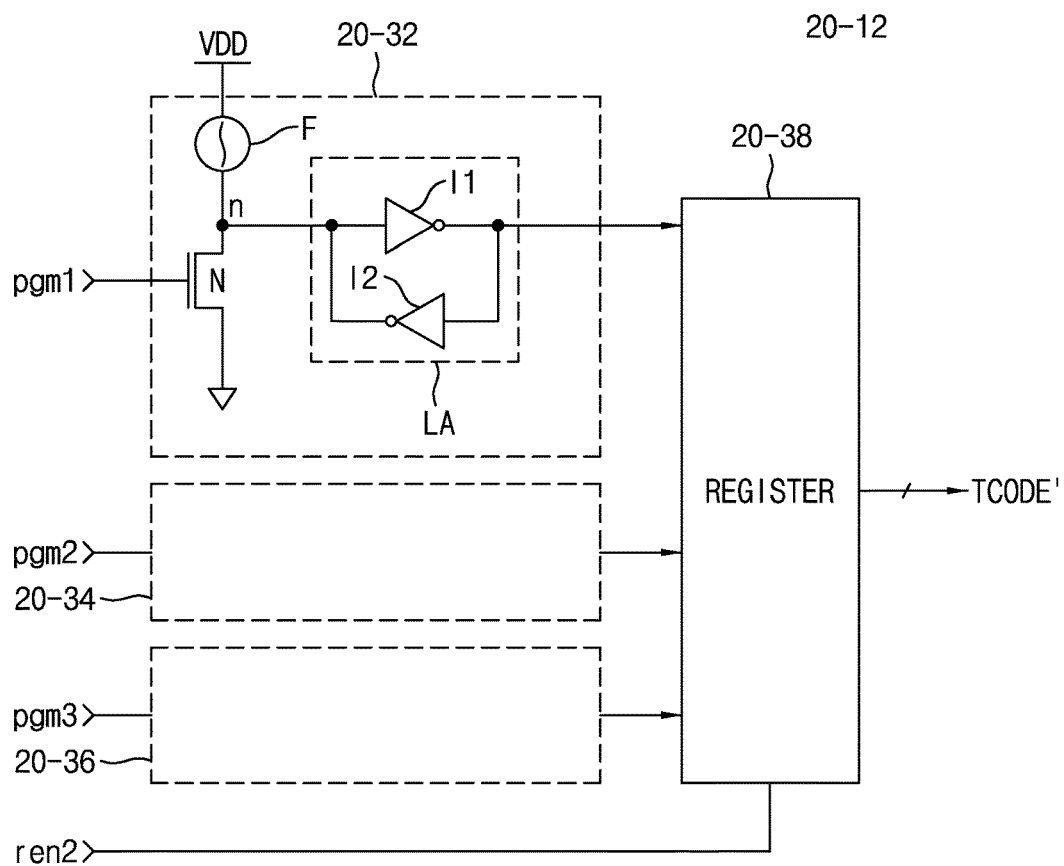
FIG. 9 is a block diagram showing a configuration of a program unit according to an exemplary embodiment of the present inventive concept.

FIG. 9 is a block diagram showing a configuration of a program unit according to an exemplary embodiment of the present inventive concept. The program unit 20-12 may include first, second and third fuse circuits 20-32, 20-34, and 20-36, and a register 20-38. Each of the first to third fuse circuits 20-32, 20-34, and 20-36 may include a fuse F, an n-type metal oxide semiconductor (NMOS) transistor N, and a latch LA including first and second inverters I1 and I2.

A function of each of the blocks shown in FIG. 9 will be described below.

The NMOS transistor N of each of the first to third fuse circuits 20-32, 20-34, and 20-36 may be turned on in response to a corresponding program signal pgm1, pgm2, or pgm3 having a "high" level. When the NMOS transistor N of each of the first to third fuse circuits 20-32, 20-34, and 20-36 is turned on, the fuse F of each of the first to third fuse circuits 20-32, 20-34, and 20-36 may be blown. Accordingly, a signal of a "low" level may be generated to a node n. The latch LA may invert and latch the signal of the "low" level to output a signal of a "high" level.

On the other hand, the NMOS transistor N of each of the first to third fuse circuits 20-32, 20-34, and 20-36 may be turned off in response to the corresponding program signal pgm1, pgm2, or pgm3 having a "low" level. When the NMOS transistor N of each of the first to third fuse circuits 20-32, 20-34, and 20-36 is turned off, the fuse F of each of the first to third fuse circuits 20-32, 20-34, and 20-36 may remain connected. Accordingly, a signal of a "high" level can be generated to the node n. The latch LA may invert and latch the signal of the "high" level to output a signal of a "low" level.

The register 20-38 may store the signals output from the first to third fuse circuits 20-32, 20-34, and 20-36 and output the temperature range code TCODE′ in respond to the second read pulse signal ren2. In other words, the register 20-38 may output the 3-bit programmed temperature range code TCODE′ in parallel or by single bits in series in response to the second read pulse signal ren2.

Figure 10:
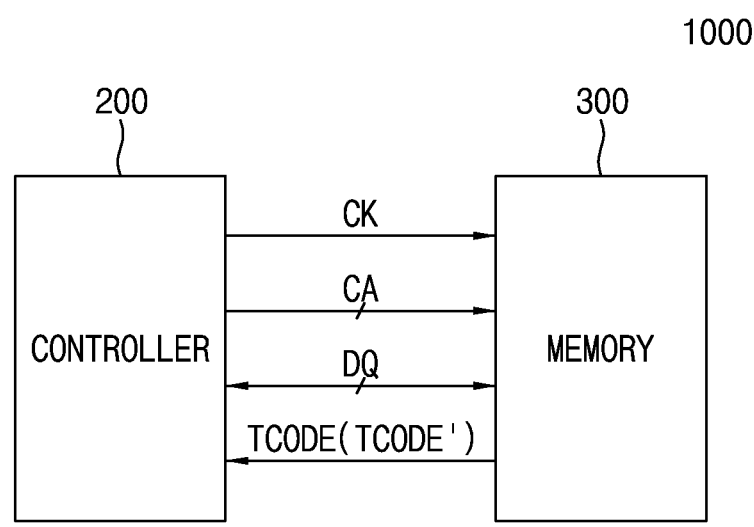
FIGS. 10 and 11 each show a block diagram of a memory system according to an exemplary embodiment of the present inventive concept.

FIG. 10 is a block diagram illustrating a configuration of a memory system according to an exemplary embodiment of the present inventive concept. The memory system 1000 may include a controller 200 and a memory 300. The controller 200 may be a central processing unit or a test apparatus, and the memory 300 may be the semiconductor memory device described with reference to FIGS. 1 to 9, or a memory module including a plurality of semiconductor memory devices.

A function of each of the blocks shown in FIG. 10 will be described below.

The controller 200 may transmit an external clock signal CK and a command and address CA to the memory 300, transmit and receive data DQ, and receive a maximum temperature code TCODE (or a temperature range code TCODE′). For example, the controller 200 may receive the maximum temperature code TCODE (or the temperature range code TCODE′), and adjust a period of applying the command and address CA according to the maximum temperature code TCODE (or the temperature range code TCODE′).

The memory 300 may receive the external clock signal CK and the command and address CA, transmit and receive data DQ, and transmit the maximum temperature code TCODE (or the temperature range code TCODE′). The memory 300 may output the maximum temperature code TCODE (or the temperature range code TCODE′) when a command signal included in the command and address CA indicates the temperature code read control signal TRD.

Figure 11:
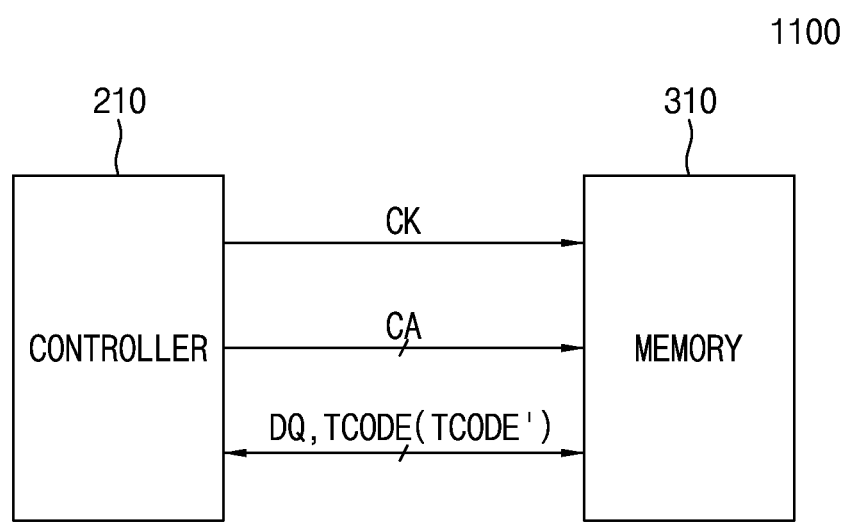

FIG. 11 is a block diagram illustrating a configuration of a memory system according to an exemplary embodiment of the present inventive concept. The memory system 1100 may include a controller 210 and a memory 310. The controller 210 may be a central processing unit or a test device, and the memory 310 may be the semiconductor memory device described with reference to FIGS. 1 to 9 or a memory module including a plurality of semiconductor memory devices.

A function of each of the blocks shown in FIG. 11 will be described below.

The controller 210 may transmit an external clock signal CK, a command and address CA, and data DQ to the memory 300, and receive data DQ and the maximum temperature code TCODE (or a temperature range code TCODE'). The controller 210 may receive the maximum temperature code TCODE (or the temperature range code TCODE') like the controller 200 shown in FIG. 10, and adjust a period of applying the command and address CA according to the maximum temperature code TCODE (or the temperature range code TCODE').

The memory 310 may receive the external clock signal CK, the command and address CA, and the data DQ, and transmit the data DQ and the maximum temperature code TCODE (or the temperature range code TCODE'). The memory 300 may output the maximum temperature code TCODE (or the temperature range code TCODE') when the command signal included in the command and address CA indicates a read command and/or a write command.

Figure 12:
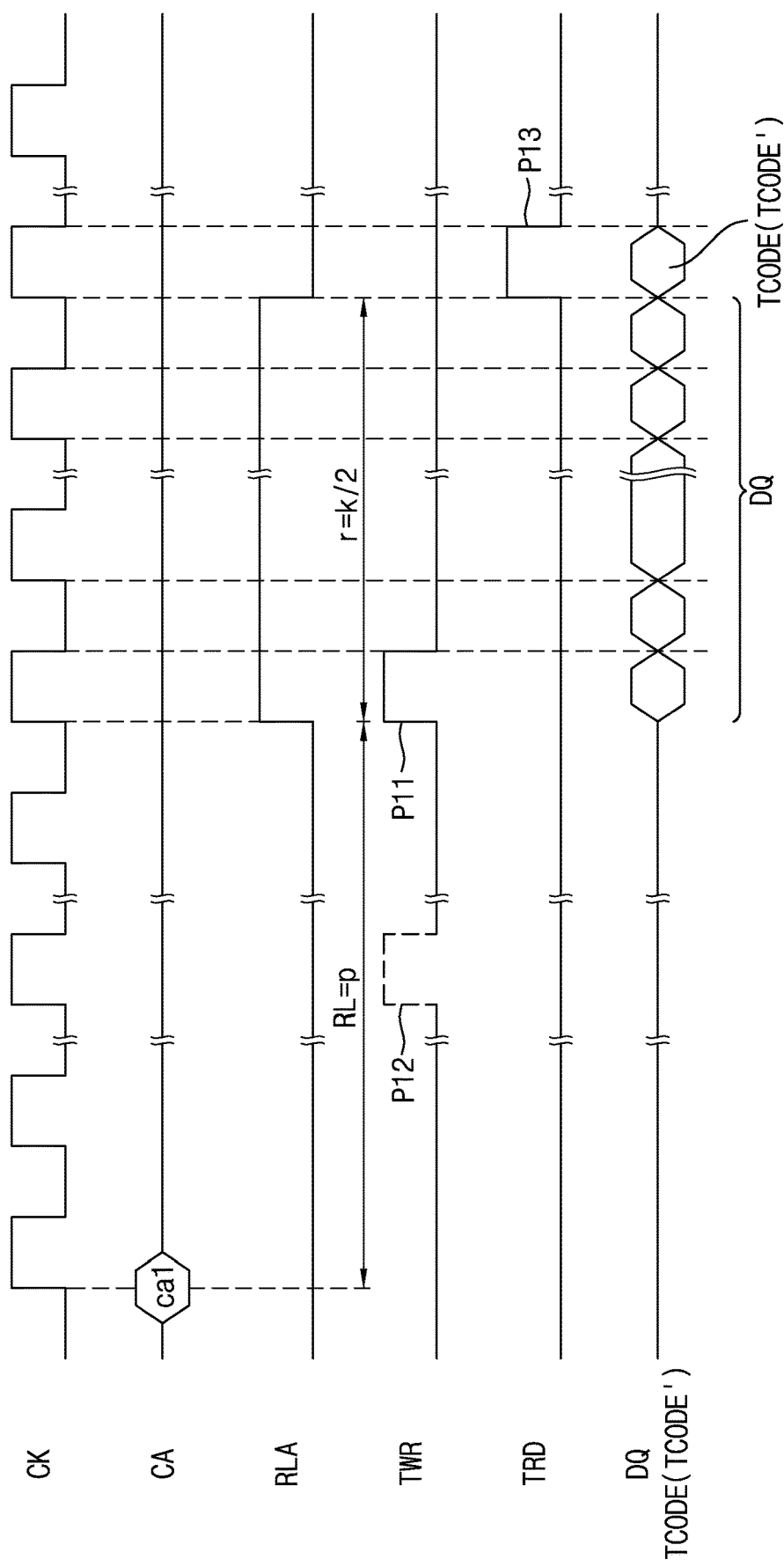
FIG. 12 is an operational timing diagram for describing a read operation of a memory system according to an exemplary embodiment of the present inventive concept.

FIG. 12 is an operational timing diagram illustrating a read operation of a memory system according to an exemplary embodiment of the present inventive concept. FIG. 12 is an operational timing diagram for describing an operation of the semiconductor memory device when a command signal included in a first command and address ca1 is a read command, a read latency RL is set to p, a burst length BL is set to k, and data DQ and a maximum temperature code TCODE (or a temperature range code TCODE') are output at a double data rate (DDR) through i data terminals.

With reference to FIGS. 1 to 9, 11, and 12, when the controller 210 transmits the first command and address ca1 in response to a rising edge of the external clock signal CK, the memory 310 may generate a read latency control signal RLA that may be activated after being delayed by p clock cycles from a corresponding rising edge of the external clock signal CK and deactivated after being delayed by p+r (=k/2) clock cycles (since the data DQ is output at the DDR). The memory 310 may transmit the data DQ during an activation period of the read latency control signal RLA. In addition, the memory 310 may generate a temperature code write control signal TWR which is a pulse signal P11 that is activated at an activation time point of the read latency control signal RLA. The memory 310 may store the maximum temperature code TCODE or the temperature range code TCODE' in response to the temperature code write control signal TWR. In other words, the memory 310 may store the maximum temperature code TCODE or the temperature range code TCODE' at a time point when the data DQ starts to be output. As another example, the temperature code write control signal TWR may be a pulse signal P12 that is activated when a read operation of the memory cell array 26 of the memory 310 is performed and is shown by a dotted line. In addition, the memory 310 may generate a temperature code read control signal TRD which is a pulse signal P13 that is activated at a deactivation time point of the read latency control signal RLA. The memory 310 may output the maximum temperature code TCODE or the temperature range code TCODE' after the data DQ is output through the i data terminals in response to the temperature code read control signal TRD.

Figure 13:
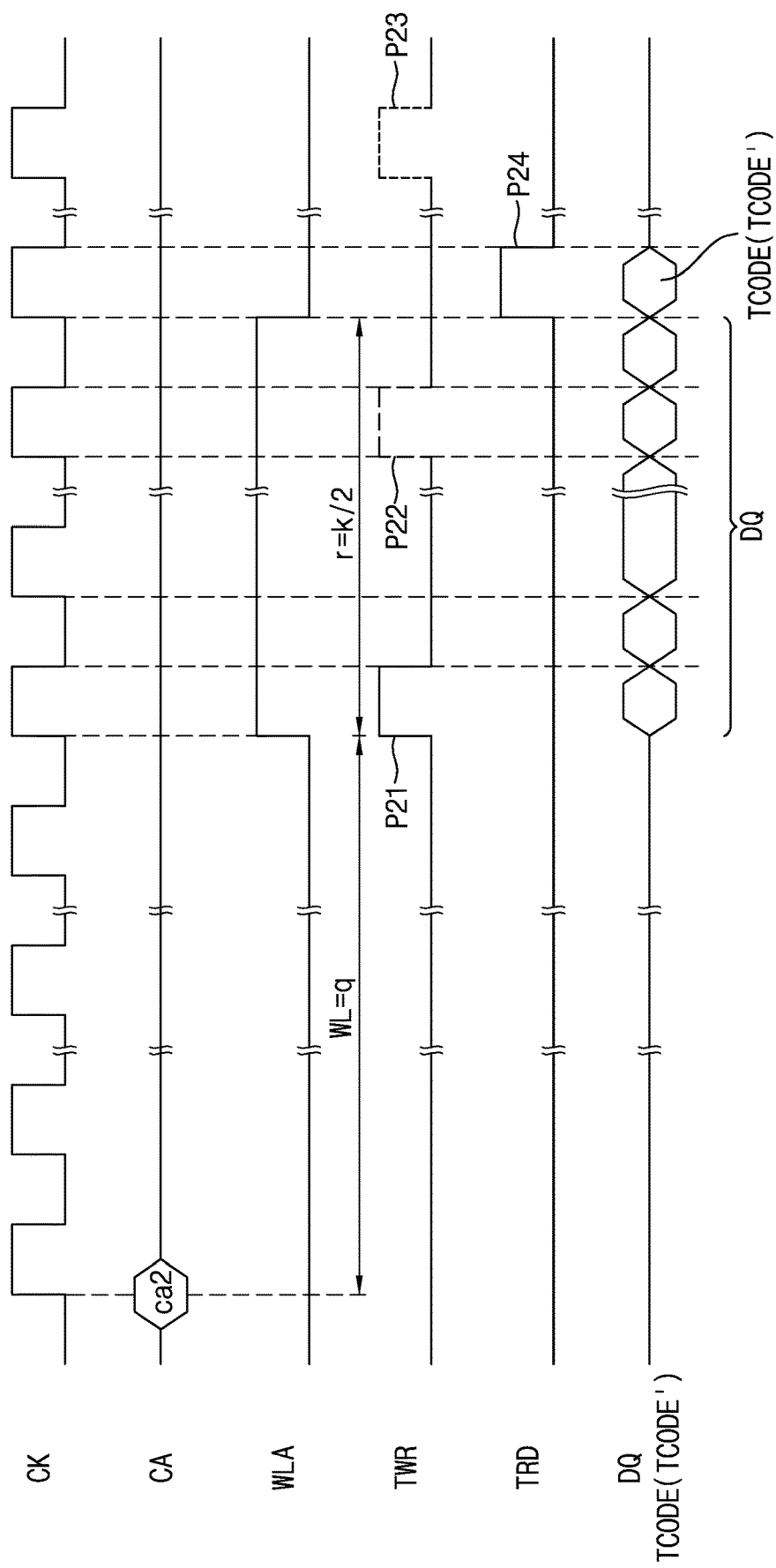
FIG. 13 is an operational timing diagram for describing a write operation of a memory system according to an exemplary embodiment of the present inventive concept.

FIG. 13 is an operational timing diagram illustrating a write operation of a memory system according to an exemplary embodiment of the present inventive concept. FIG. 13 is an operational timing diagram for describing an operation of the semiconductor memory device when a command signal included in a second command and address ca2 is a write command, a write latency WL is set to q, a burst length BL is set to k, data DQ is input at a DDR through i data terminals, and the maximum temperature code TCODE (or the temperature range code TCODE') is output through the i data terminals.

With reference to FIGS. 1 to 9, 11, and 13, when the controller 210 transmits the second command and address ca2 in response to a rising edge of the external clock signal CK, the memory 310 may generate a write latency control signal WLA which is activated after being delayed by q clock cycles from a corresponding rising edge of the external clock signal CK and deactivated after being delayed by q+r (=k/2) clock cycles (since the data DQ is input at the DDR). The memory 310 may receive the data DQ transmitted from the controller 210 during an activation period of the write latency control signal WLA. In addition, the memory 310 may generate a temperature code write control signal TWR which is a pulse signal P21 that is activated at an activation time point of the write latency control signal WLA. The memory 310 may store the maximum temperature code TCODE or the temperature range code TCODE' in response to the temperature code write control signal TWR. In other words, the memory 310 may store the maximum temperature code TCODE or the temperature range code TCODE' at a time point when the data DQ starts to be input. As another example, the temperature code write control signal TWR may be a pulse signal P22 that is activated before one clock cycle from a deactivation time point of the write latency control signal WLA, as shown by a dotted line. In addition, the memory 310 may generate a temperature code read control signal TRD which is a pulse signal P24 that is activated at the deactivation time point of the write latency control signal WLA. The memory 310 may output the maximum temperature code TCODE or the temperature range code TCODE' after the data DQ is output through the i data terminals in response to the temperature code read control signal TRD. As another example, the temperature code write control signal TWR may be a pulse signal P23 which is activated when a write operation of the memory cell array 26 of the memory 310 is performed after the write latency control signal WLA is deactivated and is shown by a dotted line. In this case, the maximum temperature code TCODE or the temperature range code TCODE' stored in response to the pulse signal P23 may be output in response to the temperature code read control signal TRD generated during a next write operation or read operation.

The semiconductor memory device according to exemplary embodiments of the present inventive concept may output data related to the internal temperature (for example, the maximum temperature code or the temperature range code) to the external source at a time point (or during) corresponding to a specific operation (for example, the read operation or the write operation, etc.) that is actually performed. Thus, the semiconductor memory device and a memory system having the same can accurately sense a temperature and output the sensed temperature (at a specific time point) when an actual operation is performed.

The memory system according to exemplary embodiments of the present inventive concept may receive the data related to the internal temperature from the semiconductor memory device to control a period of applying the command and address to the semiconductor memory device.

Accordingly, reliability of operations of the semiconductor memory device and the memory system may be improved.

While the present inventive concept has been particularly shown and described with reference to exemplary embodiments thereof, it should be understood by those skilled in the art that various modifications may be made thereto without departing from the scope of the present inventive concept as set forth by the following claims.

What is claimed is:

1. A semiconductor memory device, comprising:
a temperature sensor configured to sense an internal temperature of the semiconductor memory device and generate a temperature signal; and
a temperature code storage unit configured to receive the temperature signal in response to a temperature code write control signal that is generated when an operation corresponding to a specific command is performed, generate an operating temperature code corresponding to the temperature signal, compare the operating temperature code with a previously stored temperature code, store a larger temperature code of the operating temperature code and the previously stored temperature code as a maximum temperature code, and output the maximum temperature code to an external source in response to a temperature code read control signal.

2. The semiconductor memory device of claim 1, wherein the temperature code storage unit comprises:
an analog-to-digital converter configured to receive the temperature signal in response to the temperature code write control signal and perform an analog-to-digital conversion operation to generate the operating temperature code;
a first comparator configured to compare the operating temperature code with the previously stored temperature code to generate an output temperature code in response to the temperature code write control signal;
a pulse generator configured to generate a first read pulse signal in response to the temperature code read control signal; and
a register configured to store the output temperature code as the maximum temperature code in response to the temperature code write control signal, and output the maximum temperature code to the external source in response to the first read pulse signal.

3. The semiconductor memory device of claim 2, wherein the pulse generator is configured to generate a second read pulse signal instead of the first read pulse signal in response to the temperature code read control signal, and
the temperature code storage unit further comprises:
a second comparator configured to receive the maximum temperature code output from the register in response to the temperature code write control signal, and compare the maximum temperature code with at least one temperature range designation code designating at least two temperature ranges to generate at least two program signals indicating which one of the at least two temperature ranges the maximum temperature code belongs to; and
a program unit configured to program a temperature range code in response to the at least two program signals, and output the temperature range code.

4. The semiconductor memory device of claim 3, wherein the pulse generator generates the first read pulse signal or the second read pulse signal in response to a temperature code read selection signal, and the temperature code storage unit outputs the maximum temperature code or the temperature range code to the external source in response to the temperature code read selection signal.

5. The semiconductor memory device of claim 3, further comprising:
an internal clock signal generator configured to receive an external clock signal from the external source and generate an internal clock signal;
a command and address generator configured to receive a command and address from the external source in response to the external clock signal, decode a command signal included in the command and address to generate an active command, a read command, a write command, or a mode setting command, generate an address signal included in the command and address applied with the active command as a row address, generate the address signal included in the command and address applied with the read command or the write command as a column address, and generate the address signal included in the command and address applied with the mode setting command as a mode setting code;
a mode setting register configured to receive the mode setting code in response to the mode setting command to set a read latency, a write latency, and a burst length;
a latency controller configured to generate a read latency control signal and the temperature code write control signal using the read latency, the internal clock signal, or the burst length when the specific command is the read command, or generate a write latency control signal and the temperature code write control signal using the write latency, the internal clock signal, or the burst length when the specific command is a write command;
a row decoder configured to decode the row address to generate a plurality of word line selection signals;
a column decoder configured to decode the column address to generate a plurality of column selection signals;
a memory cell array including a plurality of memory cells, and configured to store input data in the memory cells selected by the plurality of word line selection signals and the plurality of column selection signals, or generate output data from the selected memory cells;
a data read unit configured to receive the output data output from the memory cell array in response to the read latency control signal and output the output data to the external source through data terminals; and
a data write unit configured to receive data applied from the external source through the data terminals in response to the write latency control signal and output the input data to the memory cell array.

6. The semiconductor memory device of claim 5, wherein the latency controller is further configured to generate the temperature code read control signal by using the read latency and the burst length when the specific command is the read command, or generate the temperature code read control signal using the write latency and the burst length when the specific command is the write command.

7. The semiconductor memory device of claim 6, wherein the temperature code read control signal is generated after data is output to the external source through the data terminals in response to the read latency control signal, or is generated after the data is received through the data terminals in response to the write latency control signal.

8. The semiconductor memory device of claim 6, wherein the maximum temperature code or the temperature range code is output through the data terminals.

9. The semiconductor memory device of claim 6, wherein the maximum temperature code or the temperature range code is output in series through a separate temperature code output terminal.

10. The semiconductor memory device of claim 5, wherein the command and address generator decodes the command signal to further generate the temperature code read control signal, or the mode setting register receives the mode setting code to generate the temperature code read control signal, and
the mode setting register receives the mode setting code to set the at least one temperature range designation code.

11. A semiconductor memory device, comprising:
an internal clock signal generator configured to receive an external clock signal from an external source and generate an internal clock signal;
a command and address generator configured to receive a command and address from the external source in response to the external clock signal, decode a command signal included in the command and address to generate an active command, a read command, a write command, or a mode setting command, generate an address signal included in the command and address applied with the active command as a row address, generate the address signal included in the command and address applied with the read command or the write command as a column address, and generate the address signal included in the command and address applied with the mode setting command as a mode setting code;
a mode setting register configured to receive the mode setting code in response to the mode setting command and set a read latency, a write latency, and a burst length;
a latency controller configured to generate a read latency control signal, a temperature code write control signal, and a temperature code read control signal using the read latency, the internal clock signal, or the burst length when the specific command is the read command, or generate a write latency control signal, the temperature code write control signal, and the temperature code read control signal using the write latency, the internal clock signal, or the burst length when the specific command is a write command;
a temperature sensor configured to sense an internal temperature of the semiconductor memory device and generate a temperature signal;
a temperature code storage unit configured to receive the temperature signal in response to the temperature code write control signal to generate an operating temperature code corresponding to the temperature signal, compare the operating temperature code with a previously stored maximum temperature code and store a larger temperature code of the operating temperature code and the previously stored maximum temperature code as a maximum temperature code, and output the maximum temperature code or a temperature range code corresponding to the maximum temperature code to the external source in response to the temperature code read control signal;
a row decoder configured to decode the row address to generate a plurality of word line selection signals;
a column decoder configured to decode the column address to generate a plurality of column selection signals;
a memory cell array including a plurality of memory cells, and configured to store input data in the memory cells selected by the plurality of word line selection signals and the plurality of column selection signals, or generate output data from the selected memory cells;
a data read unit configured to receive the output data output from the memory cell array in response to the read latency control signal to output the output data to the external source through data terminals; and
a data write unit configured to receive data from the external source through the data terminals in response to the write latency control signal to output the received data to the memory cell array.

12. The semiconductor memory device of claim 11, wherein the temperature code storage unit comprises:
an analog-to-digital converter configured to receive the temperature signal in response to the temperature code write control signal and perform an analog-to-digital conversion operation to generate the operating temperature code;
a first comparator configured to compare the operating temperature code with the previously stored temperature code to generate an output temperature code in response to the temperature code write control signal;
a pulse generator configured to generate a first read pulse signal in response to the temperature code read control signal; and
a register configured to store the output temperature code as the maximum temperature code in response to the temperature code write control signal, and output the maximum temperature code to the external source in response to the first read pulse signal.

13. The semiconductor memory device of claim 12, wherein the pulse generator is configured to generate a second read pulse signal instead of the first read pulse signal in response to the temperature code read control signal, and
the temperature code storage unit comprises:
a second comparator configured to receive the maximum temperature code output from the register in response to the temperature code write control signal and compare the maximum temperature code with at least one temperature range designation code designating at least two temperature ranges to generate at least two program signals indicating which one of the at least two temperature ranges the maximum temperature code belongs to; and
a program unit configured to program a temperature range code in response to the at least two program signals, and output the temperature range code.

14. The semiconductor memory device of claim 13, wherein the pulse generator generates the first read pulse signal or the second read pulse signal in response to a temperature code read selection signal, and
the temperature code storage unit outputs the maximum temperature code or the temperature range code to the external source in response to the temperature code read selection signal.

15. The semiconductor memory device of claim 14, wherein the mode setting register receives the mode setting code to set the at least one temperature range designation code or the temperature code read selection signal.

16. The semiconductor memory device of claim 15, wherein the maximum temperature code or the temperature range code is output through at least one of the data terminals.

17. The memory system of claim 15, wherein the pulse generator is further configured to generate a second read pulse signal including a second predetermined number of pulses instead of the first read pulse signal when the temperature code read control signal is received, and the temperature code storage unit further comprises:
a second comparator configured to receive the maximum temperature code output from the register in response to the temperature code write control signal and compare the maximum temperature code with at least one temperature range designation code designating at least two temperature ranges to generate at least two program signals indicating which one of the at least two temperature ranges the maximum temperature code belongs to; and
a program unit configured to be programmed in response to the at least two program signals and output the temperature range code to the external source.

18. The memory system of claim 16, wherein the pulse generator generates the first read pulse signal or the second read pulse signal when the temperature code read control signal is received in response to a temperature code read selection signal, and the temperature code storage unit outputs the maximum temperature code or the temperature range code to the external source in response to the temperature code read selection signal.

19. A memory system, comprising:
a control unit configured to transmit a command and address in response to an external clock signal, transmit and receive data, and receive a maximum temperature code; and
a memory configured to receive the command and address in response to the external clock signal, transmit and receive the data, and transmit the maximum temperature code,
wherein the memory comprises:
a temperature sensor configured to sense an internal temperature of the memory and generate a temperature signal; and
a temperature code storage unit configured to receive the temperature signal in response to a temperature code write control signal that is generated when an operation corresponding to a specific command is actually performed, generate an operating temperature code corresponding to the temperature signal, compare the operating temperature code with a previously stored temperature code, store a larger temperature code of the operating temperature code and the previously stored code as the maximum temperature code, and output the maximum temperature code to the external source in response to a temperature code read control signal.

20. The memory system of claim 19, wherein the temperature code storage unit comprises:
an analog-to-digital converter configured to receive the temperature signal in response to the temperature code write control signal and perform an analog-to-digital conversion operation to generate the operating temperature code;
a first comparator configured to compare the operating temperature code with the previously stored temperature code in response to the temperature code write control signal to output an output temperature code;
a pulse generator configured to generate a first read pulse signal including a first predetermined number of pulses when the temperature code read control signal is received; and
a register configured to store the output temperature code as the maximum temperature code in response to the temperature code write control signal, and output the maximum temperature code to the external source in response to the first read pulse signal.

* * * * *